(12) United States Patent
Arami et al.

(10) Patent No.: US 11,437,253 B2
(45) Date of Patent: Sep. 6, 2022

(54) WAFER PEDESTAL WITH CONTACT ARRAY

(71) Applicant: PIOTECH INC., Shenyang (CN)

(72) Inventors: Junichi Arami, Shenyang (CN); Ren Zhou, Shenyang (CN)

(73) Assignee: PIOTECH CO., LTD., Shenyang (CN)

( * ) Notice: Subject to any disclaimer, the term of this patent is extended or adjusted under 35 U.S.C. 154(b) by 40 days.

(21) Appl. No.: 16/887,017

(22) Filed: May 29, 2020

(65) Prior Publication Data
US 2020/0381270 A1 Dec. 3, 2020

(30) Foreign Application Priority Data

May 31, 2019 (CN) .......................... 201910467555.X (51) Int. Cl.
| | | |
|---|---|---|
| *H05B 3/68* | (2006.01) | |
| *H01L 21/67* | (2006.01) | |
| *H01L 21/687* | (2006.01) | |
| *H01R 13/24* | (2006.01) | |

(52) U.S. Cl.
CPC .. *H01L 21/67103* (2013.01); *H01L 21/68792* (2013.01); *H01R 13/2407* (2013.01)

(58) Field of Classification Search
CPC ........... H01L 21/67103; H01L 21/6875; H01L 21/68764; H01L 21/68785; H01L 21/68792; H01R 13/02; H01R 13/15; H01R 13/17; H01R 13/18; H01R 13/187; H01R 13/24; H01R 13/2407; H01R 13/33
USPC .............................................. 219/209, 444.1
See application file for complete search history.

(56) References Cited

U.S. PATENT DOCUMENTS

| | | | | |
|---|---|---|---|---|
| 5,688,331 A | * | 11/1997 | Aruga ............... | C23C 16/45521 118/725 |
| 6,368,451 B1 | * | 4/2002 | Goulette ................ | H01B 17/26 118/715 |
| 2003/0075537 A1 | * | 4/2003 | Okajima ........... | H01L 21/67103 219/444.1 |
| 2003/0089600 A1 | * | 5/2003 | Natsuhara ........... | H01L 21/6831 204/297.01 |
| 2016/0225651 A1 | * | 8/2016 | Tran .................... | H01L 21/6833 |

\* cited by examiner

*Primary Examiner* — Sang Y Paik
(74) *Attorney, Agent, or Firm* — Locke Lord LLP; Tim Tingkang Xia, Esq.

(57) ABSTRACT

The invention provides a wafer heating pedestal including a shaft connected to a bottom of a plate. The shaft holds a contact array being in contact with plural contact pads of the plate. The contact array includes plural contact columns.

10 Claims, 6 Drawing Sheets

WAFER PEDESTAL WITH CONTACT ARRAY

CROSS-REFERENCE TO RELATED APPLICATIONS

This non-provisional application claims priority under 35 U.S.C. § 119(a) on Patent Application No(s). 201910467555.X filed on May 31, 2019, the entire contents of which are hereby incorporated by reference.

BACKGROUND

Technical Field

The present invention relates to a wafer heating pedestal, particularly a wafer heating pedestal having a contact array and a cooling member.

Description of Related Art

For a conventional semiconductor processing equipment, a wafer heating pedestal within a reaction chamber is used for supporting a wafer in the chamber to carry out various processes, such as etching. During general wafer processes, there is a requirement for thermal control. Based on this purpose, the wafer heating pedestal is designed to provide a heating device for thermal control, which is able to precisely control wafer temperature in various applications of processes. In general, a wafer heating pedestal includes a ceramic or metal plate and a heating assembly enclosed in the plate, such as a heating coil. More specifically, the wafer heating pedestal can further include a thermal sensor, a controller and other electronic components.

Heating is a crucial step among the various wafer processes, such as CVD, PECVD, lithography, etching and cleaning. This is because the operative temperature plays an important role in chemical reaction processes. Reaction gas and substance on the wafer surface form a conductive thin film or an insulating layer through chemical reaction. To obtain a high quality thin film with an even thickness, the thermal control is one of several important facts during the processes.

A known wafer heating pedestal with multiple heating areas includes a plate having multiple resistance heating components, and each of the heating components is controlled by a respective controller such that the plate is able to provide distinct heating degrees over the multiple heating areas. By applying proper power to respective heating components, the temperature over the wafer is maintained, and a better result from the reaction can be obtained. In addition, the heat generated by the wafer heating pedestal will transfer downward to its bottom and whereby may interfere a temperature gradient in the processing chamber, leading to an undesired result.

Therefore, there remains a need for developing a better wafer heating pedestal with multiple heating areas while overcoming the issue of temperature gradient.

SUMMARY OF INVENTION

One objective of the invention is to provide a wafer heating pedestal, including a plate having a carrying surface for supporting a wafer and a bottom surface opposite to the carrying surface, wherein the bottom surface is provided with a plurality of contact pads; and a shaft connecting to the bottom surface of the plate and holding a contact array being in contact with the plurality of the contact pads, the contact array including a plurality of contact columns.

In some embodiments, the plate includes one more heating assemblies and one more sensing units embedded therein, and each of the one or more heating assemblies defines a heating zone of the plate, each of the one or more heating assemblies electrically connects to at least three contact pads.

In some embodiments, the plate has a plurality of vias formed therein and connecting the heating assemblies and the contact pads.

In some embodiments, the shaft holds a base positioning the plurality of contact columns.

In some embodiments, each of the plurality of the contact columns includes a pillar and a sheath cladding over the pillar, wherein the pillar is configured to move relatively to the sheath in a reciprocation way, and the sheath is received in the base.

In some embodiments, a top of the pillar has a contact cap while a spring is provided between the contact cap and the sheath.

In some embodiments, the plurality of the contact columns of the contact array electrically couples to a plurality of metal rods in order to deliver signal associated with said heating assembly and said sensing unit.

In some embodiments, the shaft connects to a cooling member which extends from an interior of the shaft to an exterior of the shaft.

In some embodiments, the cooling member connects to a bottom of the shaft, the cooling member has an upper part and a lower part wherein the upper part extends into the shaft while the lower part is exposed to the outside of the shaft and has plural cooling paths.

In some embodiments, the cooling member is configured to contact with a plurality of metal rods to transfer the heat of the plurality of metal rods.

In some embodiments, the contact array has thirty six contact columns.

In some embodiments, a portion of the cooling member is exposed to an interior of a processing chamber.

Advantages and features of the present invention will be discussed in details through the following description and drawings illustrated by the principle of invention.

BRIEF DESCRIPTION OF THE DRAWINGS

The above-mentioned and other features and advantages of the disclosure can be better understood with reference to the following detailed description and drawings.

DETAILED DESCRIPTION

Various exemplary embodiments will be described in detail with reference to the accompanying drawings that form a part of the present disclosure. Also, these embodiments are described with examples that could be carried out to achieve said embodiments, wherein sufficient details are provided to allow a person ordinarily skilled in the art to achieve said embodiments. It will be appreciated that, without departing from the spirit and scope of said embodiments, other embodiments could be used and other changes could be made. In addition, despite the foregoing, appearances of the phrase "in one embodiment" are not necessarily referring to the same or one single embodiment. Therefore, the following detailed description is not to be taken in a limiting sense, and the scope of said embodiments is defined by the appended claims alone.

Unless otherwise specified in the entire description and the appended claims, each of the following terms carries the meaning specifically defined below. As used herein, unless otherwise specified, the term "or" is to be taken in an inclusive sense, and is equivalent to the term "and/or." Unless otherwise specified herein, the term "according to" is not to be taken in an exclusive sense, and allows references to be made to many other factors not described herein. Additionally, in the entire description, the terms "a," "one" and "the" are also used in the plural sense. The term "in" is used herein to mean both "in" and "on."

The present invention provides a wafer heating pedestal adapted for various processing chambers implementing heating treatment. Particularly, the wafer heating pedestal according to the present invention is a heating pedestal with multiple heating areas such that a heating temperature close to the wafer center and another heating temperature close to the wafer edge may be different, which is able to remedy a temperature difference existed between the center and the edge of the wafer, achieving an effect of even heating.

Figure 1:
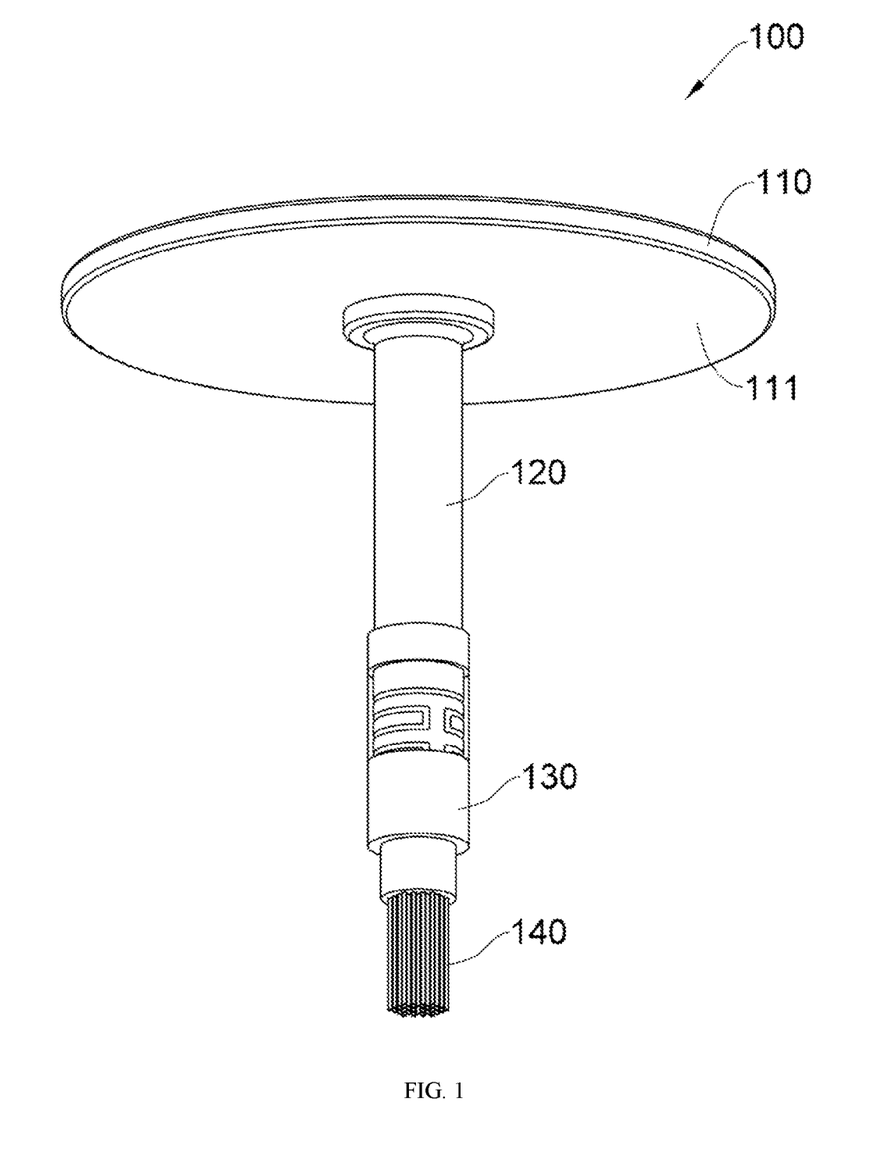
FIG. 1 is a perspective view showing a wafer heating pedestal according to the present invention.

FIG. 1 illustrates a wafer heating pedestal (100) according to the present invention, which has a similar appearance as a known wafer pedestal, having a plate (110) and a shaft (120). The plate (110) has a carrying surface (not shown) for carrying a wafer to be processed. A bottom surface (111) is opposite to said carrying surface (110). The shaft (120) connects to the bottom surface (111) of the plate (110). The shaft (120) according to the present invention has a cooling member (130) coupled to the bottom thereof for dissipating the extra heat accumulated in the heating pedestal. Details of the cooling member (130) will be described later. In one embodiment, a portion of the cooling member (130) is configured to expose to a cavity space (not shown) while the heating pedestal (100) is installed in the processing chamber (not shown). That is, the cooling member (130) will be partially exposed to a vacuum environment during the processing. Moreover, a portion of the cooling member (130) can be mechanically coupled to an external driving device. Alternatively, a portion of the cooling member (130) may be exposed to atmospheric environment outside the chamber.

Figure 2:
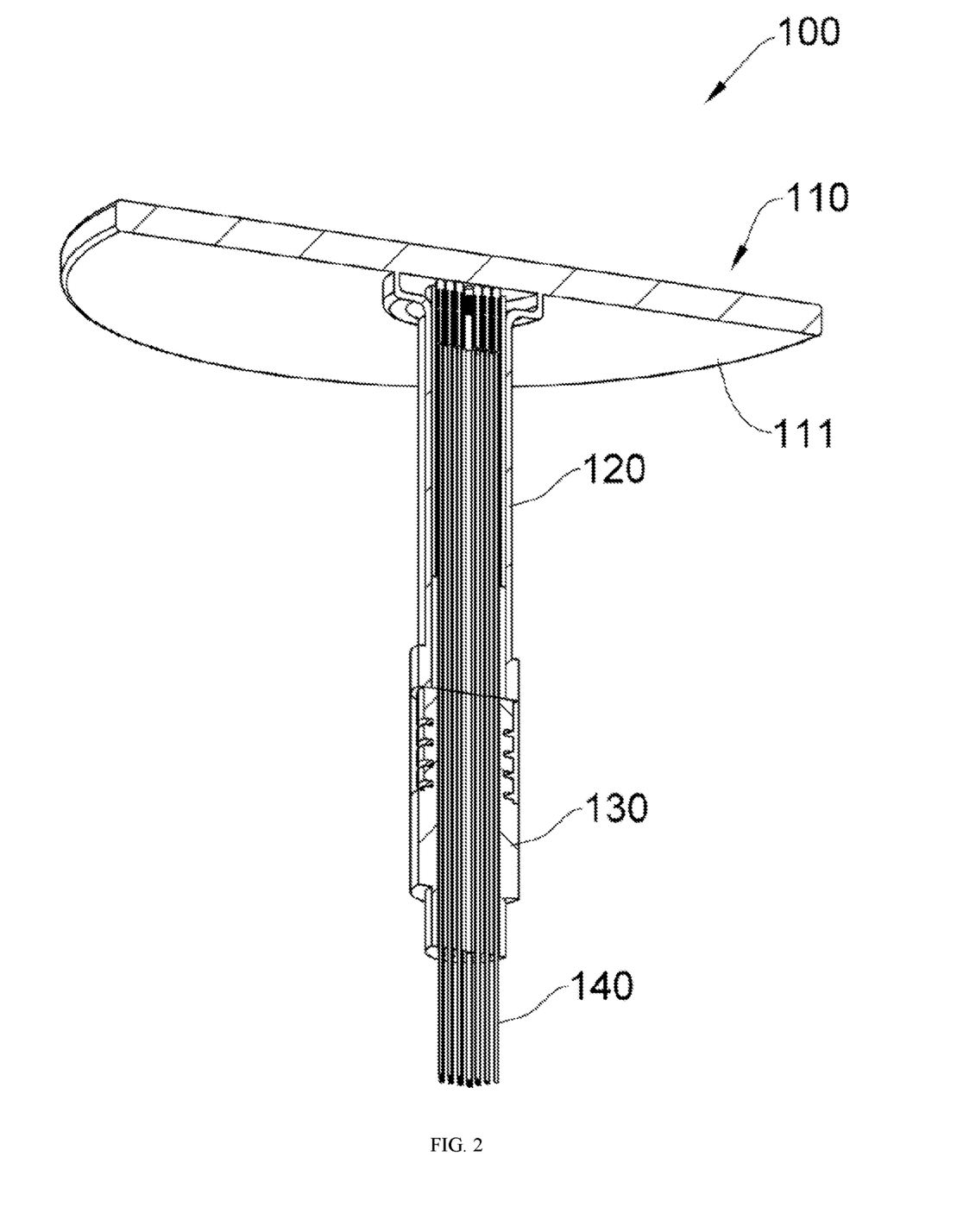
FIG. 2 is a cross-sectional view of FIG. 1.

FIG. 2 illustrates a cross-sectional view of FIG. 1. As shown in the figure, the shaft (120) is a hollow column and the cooling member (130) has a portion extending into the interior of the shaft (120). A plurality of metal rods (140) penetrates over the cooling member (130) and extends all the way to the top of the shaft (120) to electrically connect to a contact array (shown in FIG. 3). The cooling member (130) is configured to have plural holes (not numbered) for guiding the penetration of metal rods (140) and determining a layout of the metal rods (140).

The plate (110) has one or more heating components (not shown) embedded therein, such as plural independent heating coils. In an application of multiple heating areas, the plate (110) may have at least two heating coils embedded therein and respectively having different parts of radial coverage. The plate (110) may further have one or more sensing units (not shown) embedded therein, such as a resistance temperature detector (RTD), used for acquiring temperature data over different positions of the plate (110). Said heating component and sensing unit are electrically coupled to the metal rods (140), via which, to receive power and provide sensing signal. In an application of plasma processing, the plate (110) may have a metal layer (not shown) embedded therein, the metal layer is configured as a bottom electrode which is electrically coupled to an RF circuit through one of the metal rods (140). These arrangements will be described in FIG. 6.

Figure 3:
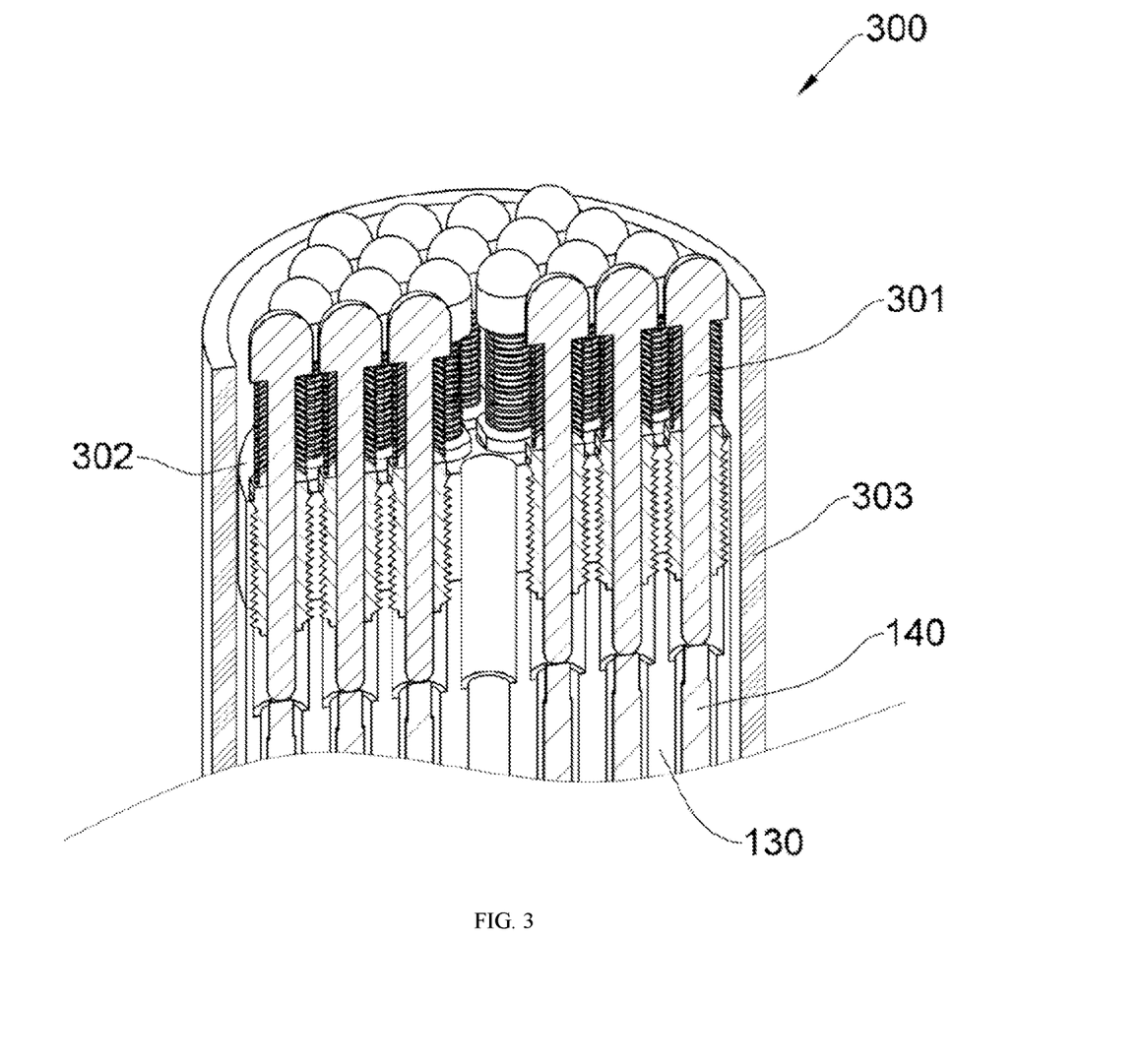
FIG. 3 shows an embodiment of a contact array according to the present invention.

FIG. 3 simply illustrates a configuration of a contact array (300) according to the present invention, without showing a wall of the shaft (120). The contact array (300) includes a plurality of contact columns (301). The embodiment illustrates thirty six contact columns (301) while less or more number of that is feasible. These contact columns (301) are securely held in a base (302) having plural holes being in a particular layout and the contact columns (301) are in contactless with each other. The shape of the base (302) fits the shaft (120), which can be, for example, a round shape. The base (302) may be made of non-conductive ceramic, such as ALN. As shown in figure, the exterior of the base (302) is in contact with the interior of an insulating wall (303) and held closed to the top of the shaft (120). The insulating wall (303) is held in between the base (302) and the wall of the shaft (120) such that the transverse spread of heat from the metal rod toward the periphery of the shaft (120) can be avoided. The insulating wall (303) is made of quartz.

As illustrated, the base (302) has an unfilled hole (not numbered) defined at its center. In the application of plasma processing, the hole may receive a contact column and a metal rod for electrically coupling the bottom electrode of the plate (101). The illustrated contact column (301) has a top terminal extending from a top surface of the base (302) and a bottom terminal extending from a bottom surface of the base (302). A top terminal of each of the metal rod (140) electrically contacts with the bottom terminal of each of the contact columns (301). The top terminals of these metal rods (140) locate at a same height, and thus the top terminals of the contact columns (301) locate at a same height. The cooling member (130) has a portion extending and adjacent to the bottom of the base (302) but without contacting the base (302). In this way, the cooling member (130) can have a maximum contact area with the metal rods (140).

Figure 4A:
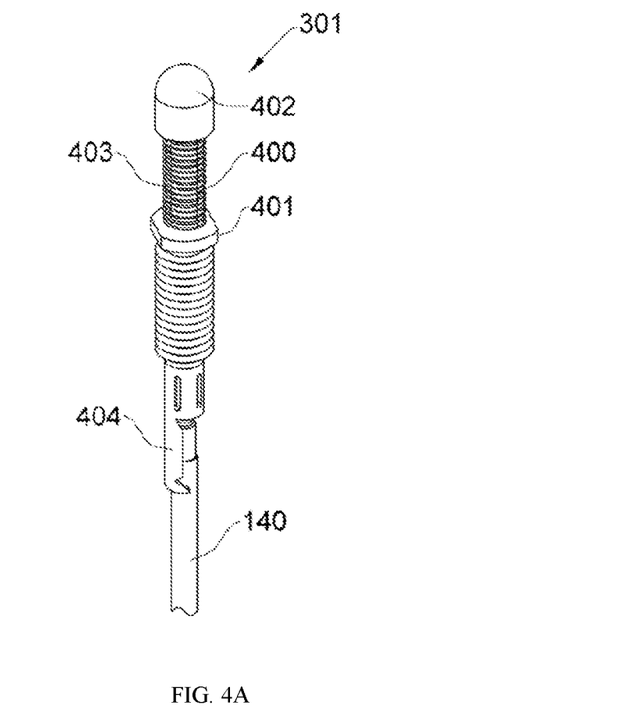
FIG. 4A shows a contact column of the contact array.
Figure 4B:
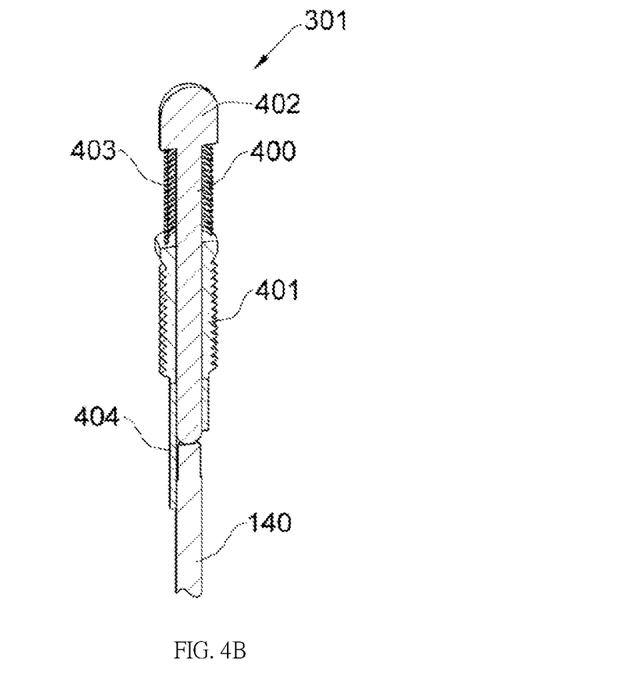
FIG. 4B shows a cross-sectional view of FIG. 4A.

FIG. 4A and FIG. 4B simply illustrate a single contact column (301) and a cross-sectional structure thereof. In fact, said contact column (301) is a movable member assembled by multiple components including a pillar (400) and a sheath (401) cladding over the pillar (400). The pillar (400) is a vertical extending structure and has a contact cap (402) on its top terminal with a curved surface for contacting with an exposed contact pad (shown in FIG. 7) of the bottom (111) of plate (110). In other possible embodiments, the contact cap (402) may be constructed in other shape or be neglected. The sheath (401) has a hole for receiving the pillar (400) and permitting the pillar (400) moves in a vertical reciprocation way relatively to the sheath (401). The sheath (401) is configured to be received in the corresponding holes of the base (302). For example, the sheath (401) is provided with a particular structure on its surface whereby the sheath (401) can securely be received in the base (302). A spring (403) is provided between the contact cap (402) of the pillar (400)

and the sheath (401), the spring (403) supports the pillar (400) at a height. The spring (403) allows a downward movement of the pillar (400) when the contact cap (402) is subjected to a press force. In other word, the contact array according to the present invention provides a flexible contact.

The bottom terminal of the pillar (400) is in electrical contact with the top terminal of the metal rod (140). A connector (404) is provided at said contact position for electrically connecting or holding the pillar (400) and the metal rod (140). For example, said connector (404) may be a crimp connector. In some embodiments, other types of connector may be feasible or be neglected. Referring back to FIG. 3, the connectors are disposed at a space between the base (302) and the cooling member (130) when the contact columns (301) are held by the base (302).

Figure 5:
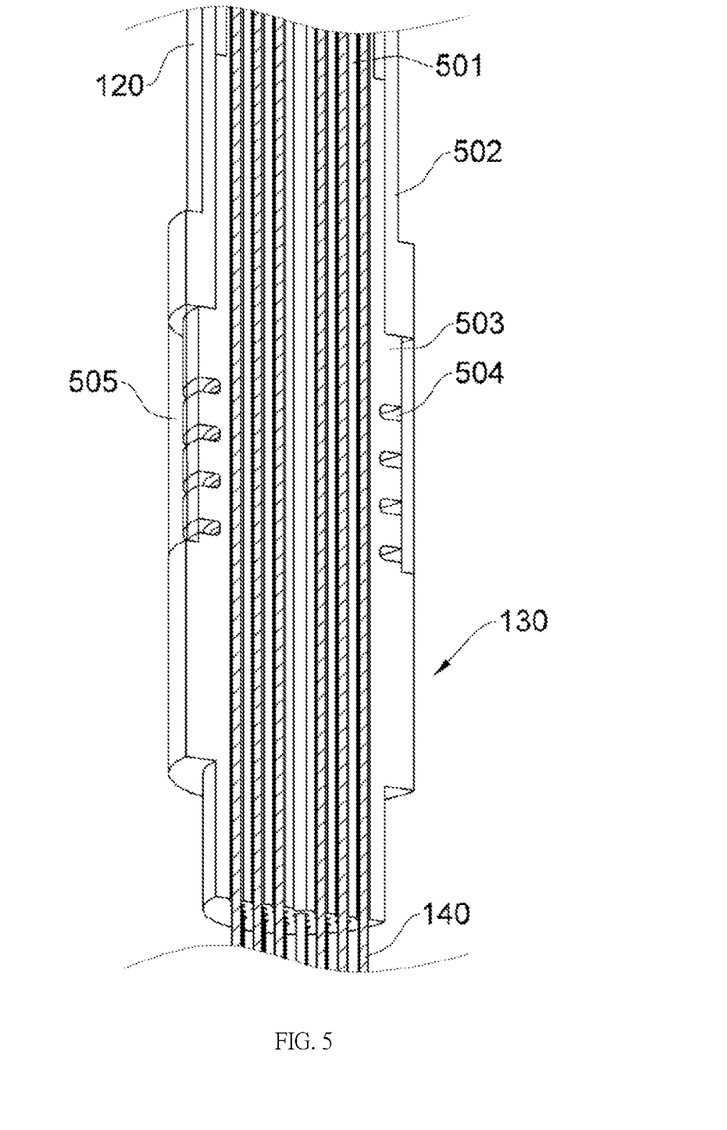
FIG. 5 shows a cross-sectional view of a cooling member according to the present invention.

FIG. 5 illustrates a cross-sectional view of the cooling member (130) according to the present invention. The cooling member (130) connects to the bottom of shaft (120) and extends from the interior of shaft (120) to its exterior. That is, a portion of the cooling member (130) is hidden in the shaft (120) while another portion of the cooling member (130) is exposed to the cavity of the processing chamber. Specifically, the cooling member (130) has an upper part (501) and a lower part (502), wherein the upper part (501) extends inside the shaft (120) and the lower part (502) is exposed to the outside of the shaft (120). The cooling member (130) has a shoulder (503) for contacting with the bottom of the shaft (120) and whereby defines the upper part (501) extending in the shaft (120) and the lower part (502) exposed out of the bottom of the shaft (120). The cooling member (130) has plural holes for receiving the metal rods (140) and contacting the surface of metal rods (140) as much as possible. As such, the heat accumulated on the metal rods (140) can be transferred from the upper part (501) to the lower part (502) of the cooling member (130).

As shown in figure, the lower part (502) further has plural grooves (504) recessed from the surface of cooling member (130), and whereby increasing a contact area with the peripheral environment of the cooling member (130). In one embodiment, a collar (505) is provided on the exterior of the cooling member (130) and communicating with the grooves (504) in order to form a cooling channel with water flow, enhancing the performance of the cooling member (130). That is, the cooling member (130) according to the present invention may be further coupled to a water supplying device.

In one embodiment, although not shown in the drawing, the lower part (502) of the cooling member (130) has a portion exposed to the cavity of the processing chamber while a another portion of the lower part (502) connecting to a driving device or exposed to the atmospheric environment outside the processing chamber. In one embodiment, the interior space of the shaft (120) is a vacuum environment and does not communicate with cavity of the processing chamber.

Figure 6:
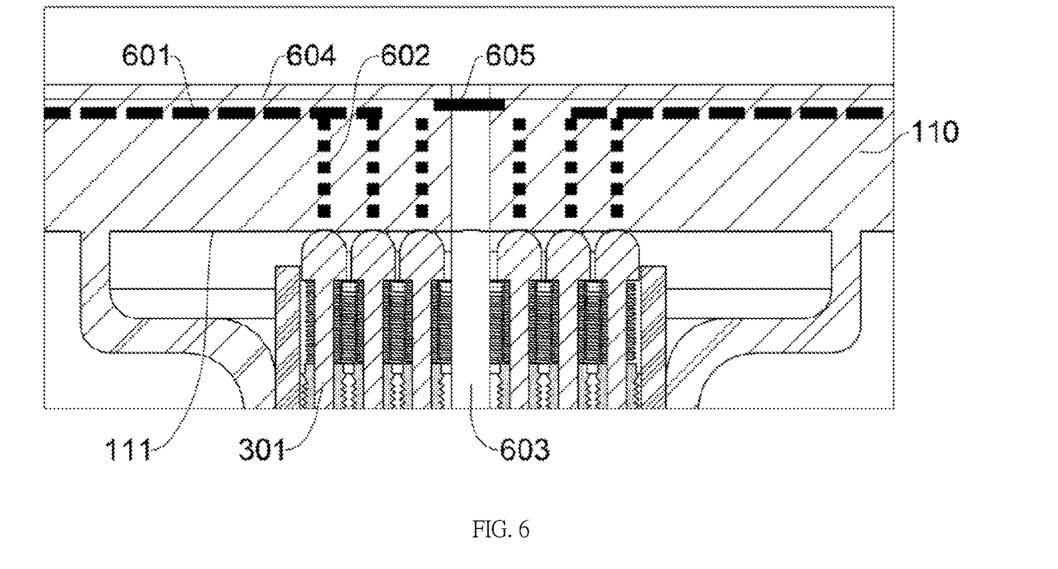
FIG. 6 shows the contact array contacting with the bottom of the plate according to the present invention.

FIG. 6 schematically shows a cross sectional view of the partial plate (110). The contact columns (301) of the contact array is biased by the springs to contact with the bottom surface (111) of the plate (110). The plate (110) has plural heating assemblies embedded therein, such as heating coils. The drawing only illustrates one heating assembly (601) located about the center of the plate (110) while another heating assembly may be located about the edge of the plate (110). The heating assembly (601) electrically couples to some of the contact columns (301) through plural vias (602). For example, four contact columns is shown in the embodiment. The via (602) may include a vertical via and a lateral via. However, only a vertical is presented herein. In addition, two of these vias (602) may be electrically connected by a lateral vias (not shown) such that two of these contact columns (301) may be able to electrically connect to another heating assembly (not shown).

A metal rod (603) is arranged at the center of the contact array, and the metal rod (603) is inserted into the plate (110) and extends to a bottom electrode (604). The metal rod (603) may be made of nickel. The top of the metal rod (604) electrically connects to the bottom electrode through a welding joint (605). Similar to PCB manufacturing, the plate (110) and electronic components thereof may be manufactured by multi-layered stacked ceramic sheets.

Figure 7:
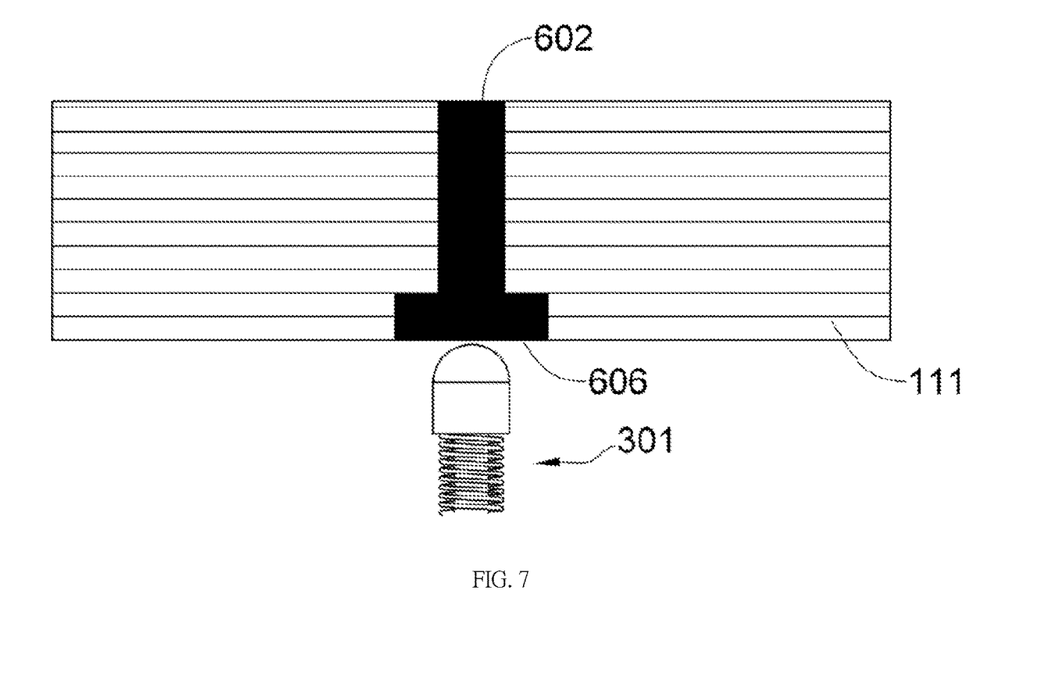
FIG. 7 shows a connection between a contact pad and a contact column.

FIG. 7 schematically illustrates a stacked structure of the plate (110). The bottom of each of the vias (602) connects to a contact pad (606). The contact pad (606) is configured to expose, with its bottom surface, at and coplanar with the bottom surface (111) of the plate (110). Preferably, the area of the contact pad (606) is larger than a width of the contact column (301) to ensure fully contact. In some embodiments, the contact pad (606) may be configured to slightly protruding from the bottom surface (111) or slightly retracted from the bottom surface (111). In possible embodiments, the contact pad (606) may be removed or be part of each via (602). The number and positions of the contact pads (606) are determined by the layout of the contact array. For example, there could be at least three contact pads (606) connect to the same one heating assembly, but no more than five.

Above all, the present provides a particular contact array for a wafer heating pedestal, such contact array permits a better connection between the metal rods and the electronic components to complete tasks of power supplying and receiving sensing signal. In addition, the present invention provides a cooling member which enhances the cooling ability to whereby facilitate manufacturing applications requiring heating treatments.

The above-mentioned details provide a thorough description regarding the manufacture and use of combinations of said embodiments. Various embodiments can be made without departing from the spirit and scope of such description. Thus, these embodiments will be included in the appended claims.

What is claimed is:

1. A wafer heating pedestal, comprising:
  a plate having a carrying surface for supporting a wafer and a bottom surface opposite to the carrying surface, wherein the bottom surface is provided with a plurality of contact pads; and
  a shaft connecting to the bottom surface of the plate and holding a contact array being in contact with the plurality of the contact pads, the contact array including a plurality of contact columns,
  wherein each of the plurality of the contact columns includes a pillar, a sheath cladding over the pillar and a spring exposed between the pillar and the sheath, wherein the pillar is configured to move relatively to the sheath in a reciprocation way, the pillar has a contact cap provided on a top thereof for contacting with the corresponding one of the contact pads, and two ends of the spring connect to the contact cap and the sheath respectively to provide a bias force therebetween.

2. The wafer heating pedestal as claimed in claim 1, wherein the plate includes one more heating assemblies and one more sensing units embedded therein, and each of the one or more heating assemblies defines a heating zone of the plate, each of the one or more heating assemblies electrically connects to at least three contact pads.

3. The wafer heating pedestal as claimed in claim 2, wherein the plate has a plurality of vias formed therein and connecting the heating assemblies and the contact pads.

4. The wafer heating pedestal as claimed in claim 1, wherein the shaft holds a base positioning the plurality of contact columns, wherein the sheath of each of the plurality of contact columns is received in the base.

5. The wafer heating pedestal as claimed in claim 2, wherein the plurality of the contact columns of the contact array electrically couples to a plurality of metal rods in order to deliver signal associated with said heating assembly and said sensing unit.

6. The wafer heating pedestal as claimed in claim 1, wherein the shaft connects to a cooling member which extends from an interior of the shaft to an exterior of the shaft.

7. The wafer heating pedestal as claimed in claim 6, wherein the cooling member connects to a bottom of the shaft, the cooling member has an upper part and a lower part wherein the upper part extends into the shaft while the lower part is exposed to the outside of the shaft and has plural cooling paths.

8. The wafer heating pedestal as claimed in claim 6, wherein the cooling member is configured to contact with a plurality of metal rods to transfer the heat of the plurality of metal rods.

9. The wafer heating pedestal as claimed in claim 1, wherein the contact array has thirty six contact columns.

10. A processing chamber, comprising the wafer heating pedestal as claimed in claim 6, wherein a portion of the cooling member is exposed to an interior of the processing chamber.

* * * * *